United States Patent
Fastow et al.

(10) Patent No.: US 8,896,048 B1
(45) Date of Patent: Nov. 25, 2014

(54) APPARATUS AND METHOD FOR SOURCE SIDE IMPLANTATION AFTER SPACER FORMATION TO REDUCE SHORT CHANNEL EFFECTS IN METAL OXIDE SEMICONDUCTOR FIELD EFFECT TRANSISTORS

(75) Inventors: Richard Fastow, Cupertino, CA (US); Zhigang Wang, Sunnyvale, CA (US); Yue-Song He, San Jose, CA (US); Kazuhiro Mizutani, Sunnyvale, CA (US); Pavel Fastenko, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 680 days.

(21) Appl. No.: 10/861,581

(22) Filed: Jun. 4, 2004

(51) Int. Cl.
*H01L 29/76* (2006.01)

(52) U.S. Cl.
USPC .... 257/314; 257/315; 257/316; 257/E21.422; 257/E29.129; 438/301; 438/303

(58) Field of Classification Search
CPC .................................................. H01L 29/7881
USPC .................. 257/314–316, 900, 288, E21.422, 257/E29.129; 438/301, 303
See application file for complete search history.

(56) References Cited

U.S. PATENT DOCUMENTS

| | | | | |
|---|---|---|---|---|
| 5,378,909 A | * | 1/1995 | Chang et al. | 257/316 |
| 5,900,666 A | * | 5/1999 | Gardner et al. | 257/401 |
| 5,901,084 A | * | 5/1999 | Ohnakado | 365/185.18 |
| 6,246,089 B1 | * | 6/2001 | Lin et al. | 257/315 |
| 6,597,035 B1 | * | 7/2003 | Harris | 257/315 |
| 6,753,232 B2 | * | 6/2004 | Kwak et al. | 438/301 |
| 6,812,099 B2 | * | 11/2004 | Lin et al. | 438/262 |
| 7,120,063 B1 | * | 10/2006 | Liu et al. | 365/185.24 |
| 7,651,910 B2 | * | 1/2010 | Beaman et al. | 438/257 |
| 2003/0017670 A1 | * | 1/2003 | Luoh et al. | 438/257 |
| 2003/0181028 A1 | * | 9/2003 | Yeap et al. | 438/595 |
| 2003/0193360 A1 | * | 10/2003 | Lee et al. | 327/262 |
| 2003/0201489 A1 | * | 10/2003 | Huang | 257/315 |

OTHER PUBLICATIONS

Streetman et al., "Solid State Electronic Devices", 2000, Prentice Hall, 5th ed, pp. 430-431.*

* cited by examiner

*Primary Examiner* — Jose R Diaz

(57) ABSTRACT

The present invention provides an apparatus and method for a metal oxide semiconductor field effect transistor (MOSFET) fabricated to reduce short channel effects. The MOSFET includes a semiconductor substrate, a gate stack formed above the semiconductor substrate, a drain side sidewall spacer formed on a drain side of the gate stack, a source side sidewall spacer formed on a source side of the gate stack, and source and drain regions. The source region is formed in the semiconductor substrate on the source side, and is aligned by the source side sidewall spacer to extend an effective channel length between the source region and drain region. The drain region is formed on the drain side in the semiconductor substrate, and is aligned by drain side sidewall spacer to further extend the effective channel length.

21 Claims, 5 Drawing Sheets

APPARATUS AND METHOD FOR SOURCE SIDE IMPLANTATION AFTER SPACER FORMATION TO REDUCE SHORT CHANNEL EFFECTS IN METAL OXIDE SEMICONDUCTOR FIELD EFFECT TRANSISTORS

TECHNICAL FIELD

The present invention relates to the field of microelectronic integrated circuits. Specifically, the present invention relates to metal oxide semiconductor field effect transistor flash memory devices.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for nonvolatile data storage.

A typical configuration of a flash memory cell consists of a thin, high-quality tunnel oxide layer sandwiched between a conducting polysilicon floating gate and a crystalline silicon semiconductor substrate. The tunnel oxide layer is typically composed of silicon oxide ($Si_xO_y$). The substrate includes a source region and a drain region that can be separated by an underlying channel region. A control gate is provided adjacent to the floating gate, and is separated by an interpoly dielectric. Typically, the interpoly dielectric can be composed of an oxide-nitride-oxide (ONO) structure.

A typical configuration of an array of flash memory cells includes rows and columns of flash memory cells. The array is supported by word lines and bit lines, wherein the word lines are coupled to gates of flash memory cells, and the bit lines are coupled to drains. The sources of the flash memory cells are commonly coupled together.

The flash memory cell stores data by holding charge within the floating gate. In a write or program operation, charge can be placed on the floating gate through hot electron injection, or Fowler-Nordheim (F-N) tunneling. In addition, F-N tunneling can be typically used for erasing the flash memory cell through the removal of charge on the floating gate.

Prior Art FIG. 1 is a diagram of an exemplary MOSFET transistor 100 used as a flash memory device. Prior Art FIG. 1 illustrates the negative effects of punch-through due to reduced gate lengths. The MOSFET 100 includes a substrate 110 that includes a source region 140 and a drain region 170 that is separated by an underlying channel region under the stacked gate structure 120. The source region 140 intrudes under the gate stack 120. The drain region 170 also intrudes under the gate stack 120. These intrusions shorten the effective channel length between the source region 140 and the drain region 170.

As flash memory technology progresses, emphasis is directed to reduce the size of the memory cells in the flash memory. However, continued reduction in size of the gate length of the MOSFET has been limited by short channel effects. Specifically, the behavior of the transistor is negatively governed by punch-through of electrons at the higher voltages. When the effective channel length between the source region 140 and the drain region 170 becomes too short, the depletion region under the gate stack 120 is formed partly by the bias voltage on the drain region 170 and the built-in potential of the source region 140. As a result, the depletion region 180 due to the bias voltage on the drain region 170 can extend to the depletion region 150 surrounding the source region 140.

Correspondingly, the barrier for electron injection from the source region 140 to the drain region 170 decreases due to the extension of the depletion region 180. Specifically, at positive drain voltages, the effective energy barrier height for electrons can be reduced resulting in electrons migrating from the source region 140 to the drain region 170. This is known as drain induced barrier lowering (DIBL).

In the worst case, when the depletion regions 180 and 150 touch each other punch-through will occur. This will result in loss of gate control over the channel, and result in significant current flow from the source 140 to the drain 170.

Thus, even when the MOSFET 100 is turned off by biasing the stacked gate to zero volts, for voltages that are applied to the drain region 170, an unwanted current can flow from the source region 140 to the drain region 170 due to punch-through. This in turn reduces the breakdown voltage of the MOSFET 100.

What is needed is an apparatus and method for reducing short channel effects in flash memory cells.

DISCLOSURE OF THE INVENTION

The present invention provides an apparatus and method for a metal oxide semiconductor field effect transistor (MOSFET) fabricated to reduce short channel effects. The embodiment of the apparatus discloses a MOSFET comprising a semiconductor substrate, a gate stack formed above the semiconductor substrate, a drain side sidewall spacer formed on a drain side of the gate stack, a source side sidewall spacer formed on a source side of the gate stack, and source and drain regions. The source region is formed in the semiconductor substrate on the source side, and is aligned by the source side sidewall spacer to extend an effective channel length between the source region and drain region. The drain region is formed on the drain side in the semiconductor substrate, and is aligned by drain side sidewall spacer to further extend the effective channel length.

BRIEF DESCRIPTION OF THE DRAWINGS

Prior Art

BEST MODES FOR CARRYING OUT THE INVENTION

Reference will now be made in detail to the preferred embodiments of the present invention, an apparatus and method for a metal oxide semiconductor field effect transistor (MOSFET) fabricated to reduce short channel effects. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, embodiments of the present invention disclose MOSFETs exhibiting source and/or drain regions aligned with sidewall spacers to extend the effective channel length between the source and drain regions. As such, embodiments of the present invention have higher breakdown voltages than the MOSFETs of the prior art, by providing further separation of the drain deletion region from the source depletion region. As a result, leakage currents are reduced making embodiments of the present invention more reliable than conventional MOSFETs.

Figure 1:
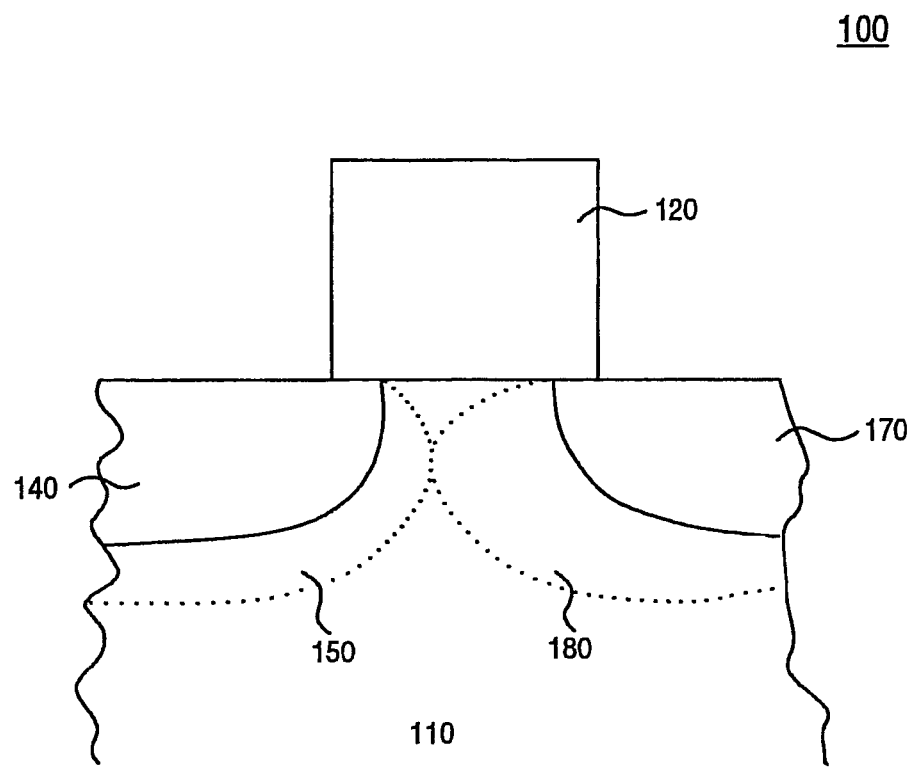
FIG. 1 is a cross sectional diagram of a metal oxide semiconductor field effect transistor (MOSFET) with a short gate length illustrating punch-through of electrons between a source region and a drain region.
Figure 2:
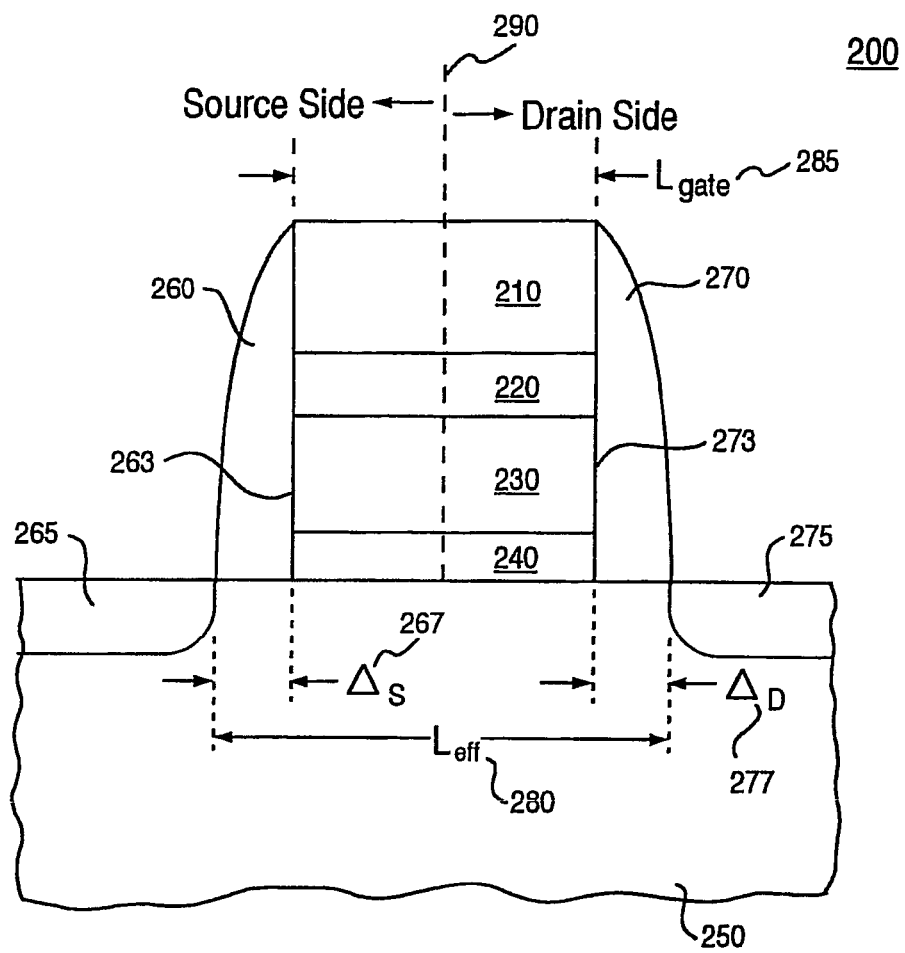
FIG. 2 is a flow chart illustrating steps in a method for fabricating a non-volatile flash memory cell exhibiting a source and drain regions aligned by sidewall spacers that extends the effective channel length between the source and drain regions, in accordance with one embodiment of the present invention.
Figure 3:
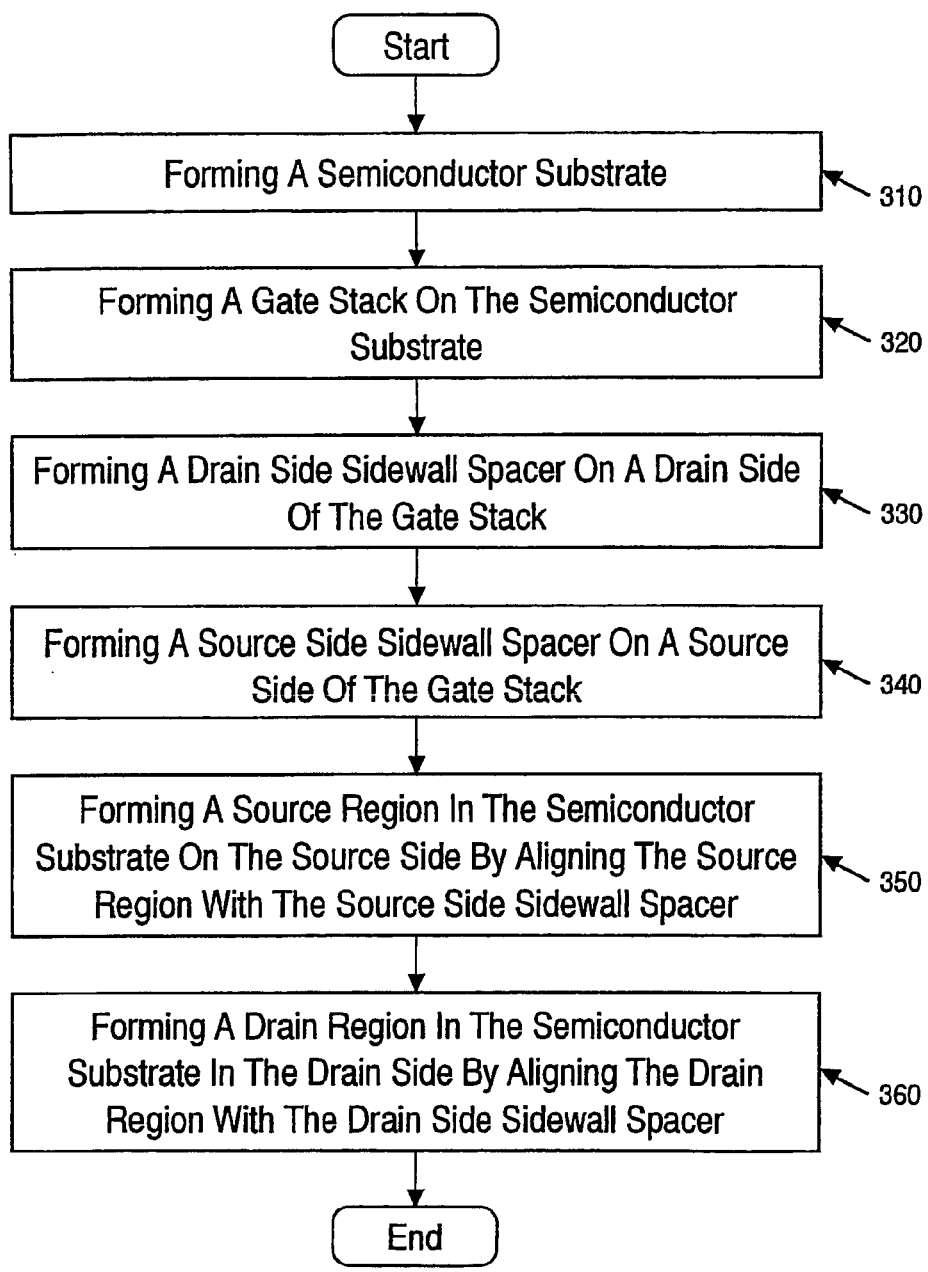
FIG. 3 is a diagram of a non-volatile flash memory cell exhibiting source side and drain side implantations aligned by sidewall spacers that extends the effective channel length between source and drain regions, in accordance with one embodiment of the present invention.

FIG. 2 in combination with FIG. 3 disclose a MOSFET structure and a method for fabricating the MOSFET structure, wherein the MOSFET exhibits source and drain side implantations after sidewall spacer formation that extend the effective channel length between source and drain regions of the MOSFET. The MOSFET as disclosed by FIGS. 2 and 3 is capable of reducing short channel effects, thereby reducing leakage currents due to punch through effects.

Referring now to FIG. 2, a cross sectional diagram of a flash memory device is shown, according to one embodiment of the present invention. The flash memory device is a non-volatile memory device. The flash memory cell can be implemented within an array of memory cells. Although this memory device is shown as a flash memory device for illustration, brevity, and clarity, it should be understood that other devices could be employed in conjunction with the present invention.

The flash memory device 200 is configured as a MOSFET 200 and exhibits an extended effective channel length $L_{eff}$ 280 that reduces short channel effects for the MOSFET 200, in accordance with one embodiment of the present invention. The MOSFET 200 consists of a gate stack formed on top of the semiconductor substrate 250. The gate stack consists of a thin, high-quality tunnel oxide layer 240 sandwiched between a conducting polysilicon floating gate 230 and the p-type crystalline silicon semiconductor substrate 250. The tunnel oxide layer 240 is typically composed of silicon oxide ($Si_xO_y$). The tunnel oxide layer 240 allows electrons, when sufficient field strength is applied, to tunnel through into a floating gate 230.

Further, the gate stack consists of a polysilicon control gate 210 of a first p-type material that is provided adjacent to the floating gate 230 of a second p-type material, and is separated by an interpoly dielectric layer 220. Typically, the interpoly dielectric layer 220 is composed of an oxide-nitride-oxide (ONO) structure. The dielectric layer 220 serves to insulate the floating gate 230 from the control gate 210. It should be understood that, although the ONO structure is being shown for illustration and clarity, any dielectric material suitable for insulating floating gate 230 from the control gate 210 may be used.

Also included in the MOSFET 200, a source region 265 is formed in the substrate 250. The source region 265 defines a source side of the MOSFET 200 as depicted to the left of dotted line 290. The source region 265 is aligned to the source side sidewall spacer 260. Specifically, the source side sidewall spacer 260 blocks the implantation of n-type dopants into the substrate 250 below the source sidewall spacer 260. As a result, the MOSFET 200 as depicted in FIG. 2 illustrates that the source region 265 is offset from the source side edge 263 of the MOSFET 200 by a distance $\Delta_S$ 267.

In addition, the MOSFET 200 also includes a drain region 275 that is formed in the substrate 250. The drain region 275 defines a drain side of the MOSFET 200 as depicted to the right of dotted line 290. The drain region 275 is aligned to the drain side sidewall spacer 270. Specifically, the drain side sidewall spacer 270 blocks the implantation of n-type dopants into the substrate 250 below the drain side sidewall spacer 270. As a result, the MOSFET 200 as depicted in FIG. 2 illustrates that the drain region 275 is offset from the source side edge 273 of the MOSFET 200 by a distance $\Delta_D$ 277.

In one embodiment, the drain region 275 comprises a first n-type doping concentration that is different from a second n-type doping concentration that is implanted for the source region 265. In another embodiment, the doping concentrations for the source region 265 and the drain region 275 are approximately identical, for example, as used in a dual bit flash memory device.

For the MOSFET 200, in the substrate 250 the source region 265 and the drain region 275 are separated by an underlying channel region. The effective length $L_{eff}$ 280 of the channel region is extended by the two distances $\Delta_S$ 267 and $\Delta_D$ 277. As shown in FIG. 2, the effective channel length $L_{eff}$ 280 is extended to be greater than the gate length $L_{gate}$ 285 of the gate stack, which is an improvement over the prior art which had effective channel lengths that were shorter than the gate length $L_{gate}$ 285.

The extension of the effective channel length $L_{eff}$ 280 in the MOSFET 200 provides for greater separation between the source region 265 and the drain region 275. As a result, the MOSFET 200 exhibits reduced short channel effects, such as a reduction in leakage currents due to punch through.

FIG. 3 is a flow chart 300 illustrating steps in a method for fabricating a memory device exhibiting reduced short channel effects, in accordance with one embodiment of the present invention. Flow chart 300 includes processes of the present invention for enhancing the operational characteristics of a floating gate memory device, such as MOSFET 200 of FIG. 2.

At 310, the present embodiment begins by forming a semiconductor substrate. The substrate provides a base for the floating gate memory device, and in accordance with one embodiment, is comprised of a slightly p-type doped polysilicon material.

At 320, the present embodiment continues by forming a gate stack on the semiconductor substrate. As described previously, the gate stack is comprised of a thin, high quality tunnel oxide layer sandwiched between a conducting polysilicon floating gate and the semiconductor substrate. The tunnel oxide layer is typically composed of a silicon oxide ($Si_xO_y$). A control gate is provided adjacent to the floating gate, and is separated by an interpoly dielectric, that is typically composed of an ONO structure.

At 330, the present embodiment forms a drain side sidewall spacer on a drain side of the gate stack. Also, at 340, the present embodiment forms a source side sidewall spacer on a source side of the gate stack. Formation of the source side and drain side sidewall is performed, as follows. A spacer deposition layer is formed. Typically, the spacer deposition is of a silicon dioxide ($SiO_2$) composition. Thereafter, the source side and drain side sidewall spacers are formed by etching the spacer deposition with an appropriate mask.

At 350, the present embodiment forms a source region in the semiconductor substrate on the source side of the gate stack. The source region is formed by aligning the source region with the source side sidewall spacer. That is, the source side sidewall spacer blocks the implantation of n-type dopants into the substrate below the source side sidewall spacer. As a result, the present embodiment is able to offset the source region from a source side edge of the gate stack, and extend an effective channel length between the source region and a drain region of the memory device.

In one embodiment, the source region is implanted with n-type dopants. The n-type dopants consist of arsenic in concentrations of 1.0×10 EE 14. Other embodiments are well suited to dopant concentrations other than 1.0×10 EE 14 for the source region.

At 360, the present embodiment forms a drain region in the semiconductor substrate on the drain side of the gate stack. The drain region is formed by aligning the drain region with the drain side sidewall spacer. That is, the drain side sidewall spacer blocks the implantation of n-type dopants into the substrate below the drain side sidewall spacer. As a result, the present embodiment is able to offset the drain region from a drain side edge of the gate stack, and further extend the effective channel length between the source and drain regions.

In one embodiment, the drain region is implanted with n-type dopants of a different concentration than that of the source region. The n-type dopants of the drain region consist of arsenic in concentrations of 0.7×10 EE 15. Other embodiments are well suited to dopant concentrations other than 0.7×10 EE 15 for the drain region. Also, while embodiments of the present invention disclose using arsenic as the dopant for the source and drain regions, other embodiments are well suited to using other n-type dopants in the source and drain regions.

Figure 4:
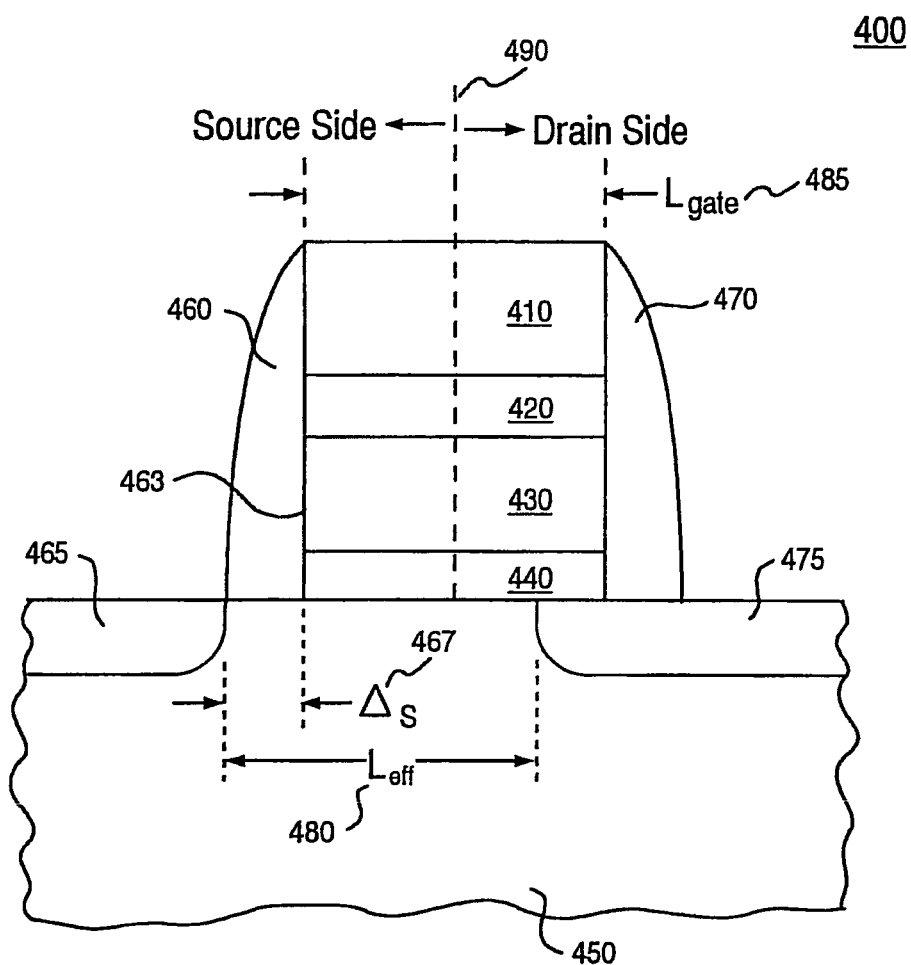
FIG. 4 is a flow chart illustrating steps in a method for fabricating a non-volatile flash memory cell exhibiting a source region aligned by a source side sidewall spacer that extends the effective channel length between source and drain regions, in accordance with one embodiment of the present invention.
Figure 5:
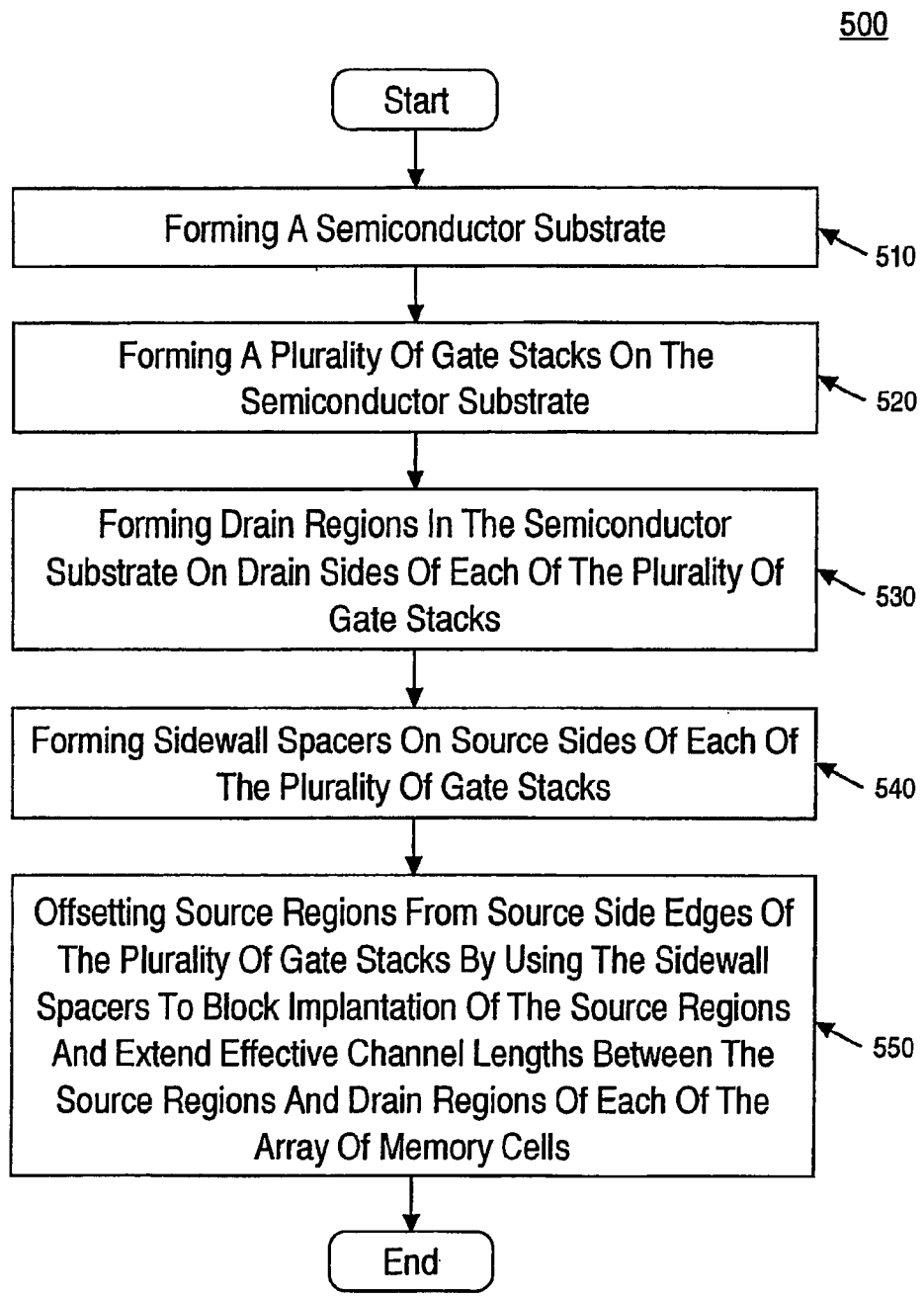
FIG. 5 is a diagram of a non-volatile flash memory cell exhibiting a source side implantation aligned by a source side sidewall spacer that extends the effective channel length between source and drain regions, in accordance with one embodiment of the present invention.

FIG. 4 in combination with FIG. 5 disclose a MOSFET structure and a method for fabricating the MOSFET structure, wherein the MOSFET exhibits source side implantations after sidewall spacer formation that extend the effective channel length between source and drain regions of the MOSFET. The MOSFET as disclosed by FIGS. 4 and 5 is capable of reducing short channel effects, thereby reducing leakage currents due to punch through effects.

Referring now to FIG. 4, a cross sectional diagram of a flash memory device is shown, according to one embodiment of the present invention. The flash memory device is a non-volatile memory device. The flash memory cell can be implemented within an array of memory cells. Although this memory device is shown as a flash memory device for illustration, brevity, and clarity, it should be understood that other devices could be employed in conjunction with the present invention.

The flash memory device 400 is configured as a MOSFET 400 and exhibits an extended effective channel length $L_{eff}$ 480 that reduces short channel effects for the MOSFET 400, in accordance with one embodiment of the present invention. The MOSFET 400 consists of a gate stack formed on top of the semiconductor substrate 450. The gate stack consists of a thin, high-quality tunnel oxide layer 440 sandwiched between a conducting polysilicon floating gate 430 and the p-type crystalline silicon semiconductor substrate 450. The tunnel oxide layer 440 is typically composed of silicon oxide ($Si_xO_y$). The tunnel oxide layer 440 allows electrons, when sufficient field strength is applied, to tunnel through into a floating gate 430.

Further, the gate stack consists of a polysilicon control gate 410 of a first p-type material that is provided adjacent to the floating gate 430 of a second p-type material, and is separated by an interpoly dielectric layer 420. Typically, the interpoly dielectric layer 420 is composed of an oxide-nitride-oxide (ONO) structure. The dielectric layer 420 serves to insulate the floating gate 430 from the control gate 410. It should be understood that, although the ONO structure is being shown for illustration and clarity, any dielectric material suitable for insulating floating gate 430 from the control gate 410 may be used.

Also included in the MOSFET 400, a source region 465 is formed in the substrate 450. The source region 465 defines a source side of the MOSFET 400 as depicted to the left of dotted line 490. The source region 465 is aligned to the source side sidewall spacer 460. Specifically, the source side sidewall spacer 460 blocks the implantation of n-type dopants into the substrate 450 below the source sidewall spacer 460. As a result, the MOSFET 400 as depicted in FIG. 4 illustrates that the source region 465 is offset from the source side edge 463 of the MOSFET 400 by a distance $\Delta_S$ 467.

In addition, the MOSFET 400 also includes a drain region 475 that is formed in the substrate 450. The drain region 475 defines a drain side of the MOSFET 400 as depicted to the right of dotted line 490. The drain region 275 is formed before the formation of the sidewall spacers, such as source side sidewall spacer 460 and drain side sidewall spacer 470. As a result, the drain region 475 extends laterally under the gate stack of the MOSFET 400.

In one embodiment, the drain region 475 comprises a first n-type doping concentration that is different from a second n-type doping concentration that is implanted for the source region 465. In another embodiment, the doping concentrations for the source region 465 and the drain region 475 are approximately identical, for example, as used in a dual bit flash memory device.

For the MOSFET 400, in the substrate 450 the source region 465 and the drain region 475 are separated by an underlying channel region. The effective length $L_{eff}$ 480 of the channel region is extended by the distance $\Delta_S$ 467. As shown in FIG. 4, the effective channel length $L_{eff}$ 480 is extended to be approximately the same or greater than the gate length $L_{gate}$ 485 of the gate stack, which is an improvement over the prior art which had effective channel lengths that were shorter than the gate length $L_{gate}$ 485.

The extension of the effective channel length $L_{eff}$ 480 in the MOSFET 400 provides for greater separation between the source region 465 and the drain region 475. As a result, the MOSFET 400 exhibits reduced short channel effects, such as a reduction in leakage currents due to punch through.

FIG. 5 is a flow chart 500 illustrating steps in a method for reducing short channel effects of memory devices in a non-volatile memory, in accordance with one embodiment of the present invention. The non-volatile memory comprises at least one array of memory cells. The array of memory cells is arranged in a plurality of word lines that are configured in a plurality of rows. In addition, the array comprises a plurality of bit lines configured in a plurality of columns.

Each of the memory cells in the array of memory cells comprises a source, a control gate that is coupled to a respective word line, and a drain that is coupled to a respective bit line. Each of the memory cells is capable of storing at least one respective bit. Flow chart 500 includes processes of the present invention for enhancing the operational characteristics of a floating gate memory device, such as MOSFET 400 of FIG. 4.

The present embodiment begins by forming a semiconductor substrate, at 510. The substrate provides a base for the floating gate memory devices in the array of memory devices, and in accordance with one embodiment, is comprised of a slightly p-type doped polysilicon material.

At 520, the present embodiment continues by forming a plurality of gate stacks on the semiconductor substrate. Operation of the gate stack has been previously described. Formation of the plurality of gate stacks proceeds by forming a plurality of tunnel oxide layers over the semiconductor substrate. The tunnel oxide layer is typically composed of a silicon oxide ($Si_xO_y$). Then, the present embodiment forms a plurality of floating gates over the plurality of tunnel oxide layers. A plurality of dielectric layers is formed over the plurality of floating gates, wherein each of said plurality of dielectric layers comprises a nitride layer sandwiched between two oxide layers. Then, a plurality of control gates is formed over the plurality of dielectric layers.

At 530, the present embodiment continues by forming drain regions in the semiconductor substrate. The drain regions are formed on drain sides of each of the plurality of gate stacks. The drain regions are formed before any formation of sidewall spacers. As a result, the drain regions intrude laterally under the gate stack in the semiconductor substrate.

At 540, the present embodiment continues by forming sidewall spacers on each of the plurality of gate stacks. In one embodiment, source side sidewall spacers are formed on the source side of each of the plurality of gate stacks. Drain side sidewall spacers can also be formed on the drain side of each of the plurality of gate stacks. Formation of the source side and drain side sidewall is performed, as follows. A spacer deposition layer is formed. Typically, the spacer deposition is of an silicon dioxide ($SiO_2$) composition. Thereafter, the source side and drain side sidewall spacers are formed by etching the spacer deposition with an appropriate mask.

At 550, the present embodiment continues by forming source regions in the semiconductor substrate on source sides of the gate stack. The present embodiment offsets the source regions from the source side edges of the plurality of gate stacks by using the source side sidewall spacers to block implantation of n-type dopants that form the source regions. That is, the source side sidewall spacer blocks the implantation of n-type dopants into the substrate below the source side sidewall spacer. As a result, the present embodiment is able to extend the effective channel lengths between source regions and drain regions of each of said array of memory cells by the offset provided between the source region and the source side edges.

In another embodiment, a plurality of shallow trench isolation (STI) regions are formed in the semiconductor substrate between each of the plurality of gate stacks to isolate memory cells in the array of memory cells.

The preferred embodiments of the present invention, an apparatus disclosing a MOSFET with source and/or drain regions aligned to sidewall spacers for extending the effective channel length between the source and drain regions, and a method for fabricating the same, are thus described. While the present invention has been described in particular embodiments, it should be appreciated that the present invention should not be construed as limited by such embodiments, but rather construed according to the below claims.

What is claimed is:

1. A metal oxide semiconductor field effect transistor (MOSFET) comprising:
    a semiconductor substrate comprising a p-type doping concentration;
    a gate stack formed above said semiconductor substrate wherein said gate stack comprises a control gate that is formed from a first material and a floating gate that is formed from a second material;
    a drain side sidewall spacer formed on a drain side of said gate stack; and
    a source side sidewall spacer formed on a source side of said gate stack wherein the effective channel length of said MOSFET extends from an outer surface of said drain side sidewall spacer formed on said drain side to an outer surface of said source side sidewall spacer formed on said source side and wherein said semiconductor substrate is free of n-type dopants in portions of said substrate underneath and directly contacting said source side sidewall spacer and said drain side sidewall spacer and the doping for an associated source and an associated drain are formed outside of the outside edges of said source and drain side sidewall spacers and does not extend within the outside edges and extends to a surface of the substrate that is coplanar with portions of the substrate that interface the gate stack wherein said control gate is fabricated with a first p-type polysilicon material and wherein said floating gate adjacent to the control gate is fabricated with a second materially different p-type base polysilicon material and separated by said dielectric layer.

2. The MOSFET of claim 1, wherein said drain side sidewall spacer blocks implantation of said drain region to offset said drain region from a drain side edge of said gate stack.

3. The MOSFET of claim 1, wherein said source side sidewall spacer blocks implantation of said source region to offset said source region from a source side edge of said gate stack.

4. The MOSFET of claim 1, wherein a first n-type doping concentration for said drain region is different from a second n-type doping concentration for said source region.

5. The MOSFET of claim 1, wherein said gate stack comprises:
    a dielectric layer formed under said control gate, and comprising a nitride layer sandwiched between two oxide layers;
    and
    a tunnel oxide layer formed between said floating gate and said semiconductor substrate.

6. The MOSFET of claim 1, wherein said substrate comprises a p-type polysilicon material.

7. A metal oxide semiconductor field effect transistor (MOSFET) comprising:
    a semiconductor substrate;

a gate stack formed above said semiconductor substrate wherein said gate stack comprises a control gate that is formed from a first material and a floating gate that is formed from a second material; and a source side sidewall spacer formed on a source side of said gate stack wherein the effective channel length of said MOSFET extends from an outer surface of a drain side sidewall spacer formed on said drain side to an outer surface of said source side sidewall spacer formed on said source side and wherein said semiconductor substrate is free of n-type dopants in portions of said substrate underneath and directly contacting said source side sidewall spacer and said drain side sidewall spacer wherein the respective doping for an associated source and an associated drain are formed outside of the outside edges of said source and drain side sidewall spacers and does not extend within the outside edges and extends to a surface of the substrate that is coplanar with portions of the substrate that interface the gate stack wherein said control gate is fabricated with a first p-type base polysilicon material and wherein said floating gate adjacent to the control gate is fabricated with a second materially different p-type base polysilicon material and formed under separated by said dielectric layer.

8. The MOSFET of claim 7, further comprising:
a drain side sidewall spacer formed to a drain side of said gate stack; and said drain region that is formed on said drain side of said gate stack in said semiconductor substrate, wherein said drain side sidewall spacer blocks implantation of said drain region to offset said drain region from a drain side edge of said gate stack and further extend said effective channel length.

9. The MOSFET of claim 7, wherein said gate stack comprises:
a control gate fabricated with a first p-type material;
an insulating layer formed under said control gate, and comprising a nitride layer sandwiched between two oxide layers;
a floating gate fabricated with a second p-type material and formed under said control gate; and
a tunnel oxide layer formed between said floating gate and said semiconductor substrate.

10. The MOSFET of claim 7, wherein a first n-type doping concentration for said drain region is different from a second n-type doping concentration for said source region.

11. A method for reducing short channel effects in a metal oxide semiconductor field effect transistor (MOSFET) comprising:
forming a semiconductor substrate;
forming a gate stack on said semiconductor substrate wherein said gate stack comprises a control gate that is formed from a first material and a floating gate that is formed from a second material;
forming a drain side sidewall spacer on a drain side of said gate stack;
forming a source side sidewall spacer on a source side of said gate stack;
forming a source region in said semiconductor substrate on said source side by aligning said source region with said source side sidewall spacer; and
forming a drain region in said semiconductor substrate in said drain side by aligning said drain region with said drain side sidewall spacer,
wherein an effective channel length between said source region and said drain region is defined by the alignment of an outer surface of said source side sidewall spacer with said source region and the alignment of an outer surface of said drain side sidewall spacer with said drain region and wherein said semiconductor substrate is free of n-type dopants in portions of said substrate underneath and directly contacting said source side sidewall spacer and said drain side sidewall spacer and the respective doping for an associated source and an associated drain are formed outside of the outside edges of said source and drain side sidewall spacers and does not extend within the outside edges and extends to a surface of the substrate that is coplanar with portions of the substrate that interface the gate stack wherein said control gate is fabricated with a first p-type base polysilicon material and wherein said floating gate adjacent to the control gate is fabricated with a second materially different p-type base polysilicon material and separated by said dielectric layer.

12. The method of claim 11, further comprising:
offsetting said drain region from a drain side edge of said gate stack by using said drain side sidewall spacer to block implantation of said drain region and extend said effective channel length between said source region and said drain region.

13. The method of claim 11, further comprising:
offsetting said source region from a source side edge of said gate stack by using said source side sidewall spacer to block implantation of said source region and extend said effective channel length between said source region and said drain region.

14. The method of claim 11, wherein said forming a drain region comprises:
implanting arsenic as an n-type impurity in concentrations of $1.0 \times 10$ EE 14.

15. The method of claim 11, wherein said forming a source region comprises implanting arsenic as an n-type impurity in concentrations of $0.7 \times 10$ FE 15.

16. The method of claim 11, wherein said forming a gate stack comprises:
forming a control gate;
forming a dielectric layer under said control gate, wherein said dielectric layer comprises a nitride layer sandwiched between two oxide layers;
forming a floating gate under said dielectric layer; and
forming a tunnel oxide layer between said floating gate and said semiconductor substrate.

17. In a non-volatile memory comprising at least one array of memory cells, wherein each of the memory cells comprise a source, a control gate, and a drain, and is capable of storing at least one bit, a method for manufacturing said array of memory cells, comprising:
forming a semiconductor substrate;
forming a plurality of gate stacks on said semiconductor substrate wherein said gate stacks comprises a control gate that is formed from a first material and a floating gate that is formed from a second material;
forming drain regions in said semiconductor substrate on drain sides of each of said plurality of gate stacks;
forming source regions in said semiconductor substrate;
forming sidewall spacers on drain sides of each of said plurality of gate stacks;
forming sidewall spacers on source sides of each of said plurality of gate stacks; and
offsetting source regions from source side edges of said plurality of gate stacks by using said sidewall spacers to block implantation of said source regions to extend the effective channel lengths between said source regions and said drain regions of each of said array of memory cells, wherein said effective channel lengths extend from outer surfaces of said drain side sidewall spacers formed on said drain sides to outer surfaces of said source side sidewall spacers formed on said source sides and wherein said semiconductor substrate is free of n-type dopants in portions of said substrate underneath and directly contacting said source side sidewall spacers and said drain side sidewall spacers wherein the respective doping for an associated source and an associated drain are formed outside of the outside edges of said source and drain side sidewall spacers and does not extend within the outside edges and extends to a surface of the substrate that is coplanar with portions of the substrate that interface the gate stack wherein said control gate is fabricated with a first p-type base polysilicon material and wherein said floating gate adjacent to the control gate is fabricated with a second materially different p-type base polysilicon material and separated by said dielectric layer.

18. The method of claim 17, wherein said forming a plurality of gate stacks comprises:
forming a plurality of control gates;
forming a plurality of dielectric layers under said plurality of control gates, wherein each of said plurality of dielectric layers comprises a nitride layer sandwiched between two oxide layers;
forming a plurality of floating gates under said plurality of dielectric layers; and forming a plurality of tunnel oxide layers between said plurality of floating gates and said semiconductor substrate.

19. The method of claim 17, wherein each of said array of memory cells comprises a metal oxide semiconductor field effect transistor.

20. The method of claim 17, further comprising:
forming a plurality of shallow trench isolation (STI) regions in said semiconductor substrate between each of said plurality of gate stacks to isolate memory cells in said array of memory cells.

21. The method of claim 17, wherein said forming sidewall spacers comprises:
depositing SiO2 to form a spacer deposition; and
etching said spacer deposition to form said sidewall spacers.

* * * * *